(12) United States Patent
Kim et al.

(10) Patent No.: US 10,991,776 B2
(45) Date of Patent: Apr. 27, 2021

(54) DISPLAY APPARATUS AND METHOD OF MANUFACTURING THE SAME

(71) Applicant: Samsung Display Co., Ltd., Yongin-si (KR)

(72) Inventors: Hyunae Kim, Seoul (KR); Jaesik Kim, Hwaseong-si (KR); Jaeik Kim, Yongin-si (KR); Yeonhwa Lee, Hwaseong-si (KR); Joongu Lee, Seoul (KR); Sehoon Jeong, Suwon-si (KR); Mijung Han, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/654,402

(22) Filed: Oct. 16, 2019

(65) Prior Publication Data

US 2020/0119114 A1 Apr. 16, 2020

(30) Foreign Application Priority Data

Oct. 16, 2018 (KR) .................... 10-2018-0123413

(51) Int. Cl.
*H01L 27/32* (2006.01)
*H01L 51/52* (2006.01)
*H01L 51/00* (2006.01)

(52) U.S. Cl.
CPC ...... *H01L 27/3246* (2013.01); *H01L 27/3262* (2013.01); *H01L 27/3265* (2013.01); *H01L 51/0016* (2013.01); *H01L 51/525* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 9,159,925 B2 | 10/2015 | Defranco | |
| 2007/0241664 A1* | 10/2007 | Sakamoto | ........... H01L 27/3276 313/503 |
| 2009/0039511 A1 | 2/2009 | Jeon | |

(Continued)

FOREIGN PATENT DOCUMENTS

| | | |
|---|---|---|
| KR | 10-0831250 B1 | 5/2008 |
| KR | 10-2017-0142231 A | 12/2017 |
| KR | 10-2018-0055024 A | 5/2018 |

*Primary Examiner* — Asok K Sarkar
(74) *Attorney, Agent, or Firm* — Lewis Roca Rothgerber Christie LLP

(57) ABSTRACT

A display apparatus includes a substrate, a pixel defining layer, a spacer, an auxiliary electrode, and an organic light emitting diode. The substrate includes a light emitting area and a non-light emitting area adjacent to the light emitting area. The pixel defining layer is disposed on the non-light emitting area of the substrate. The spacer is disposed on the pixel defining layer. The auxiliary electrode is disposed on the spacer. The organic light emitting diode is disposed on the substrate, and at least a portion thereof is disposed in the light emitting area. The organic light emitting diode includes a pixel electrode, an intermediate layer disposed on the pixel electrode and including an organic light emitting layer, and an opposite electrode disposed on the intermediate layer and electrically connected to the auxiliary electrode.

12 Claims, 12 Drawing Sheets

(56) References Cited

U.S. PATENT DOCUMENTS

| | | |
|---|---|---|
| 2016/0190521 A1* | 6/2016 | Lee ................... H01L 27/3209 257/40 |
| 2017/0365812 A1 | 12/2017 | Choung et al. |
| 2018/0138441 A1 | 5/2018 | Choung et al. |
| 2018/0159089 A1 | 6/2018 | Defranco et al. |
| 2018/0366524 A1 | 12/2018 | Bang et al. |
| 2019/0207163 A1* | 7/2019 | Paek ................... H01L 27/3223 |
| 2020/0052249 A1 | 2/2020 | Han et al. |
| 2020/0259120 A1* | 8/2020 | Furuie ................ H01L 51/5253 |
| 2020/0373378 A1* | 11/2020 | Kwon ................ H01L 51/0096 |

* cited by examiner

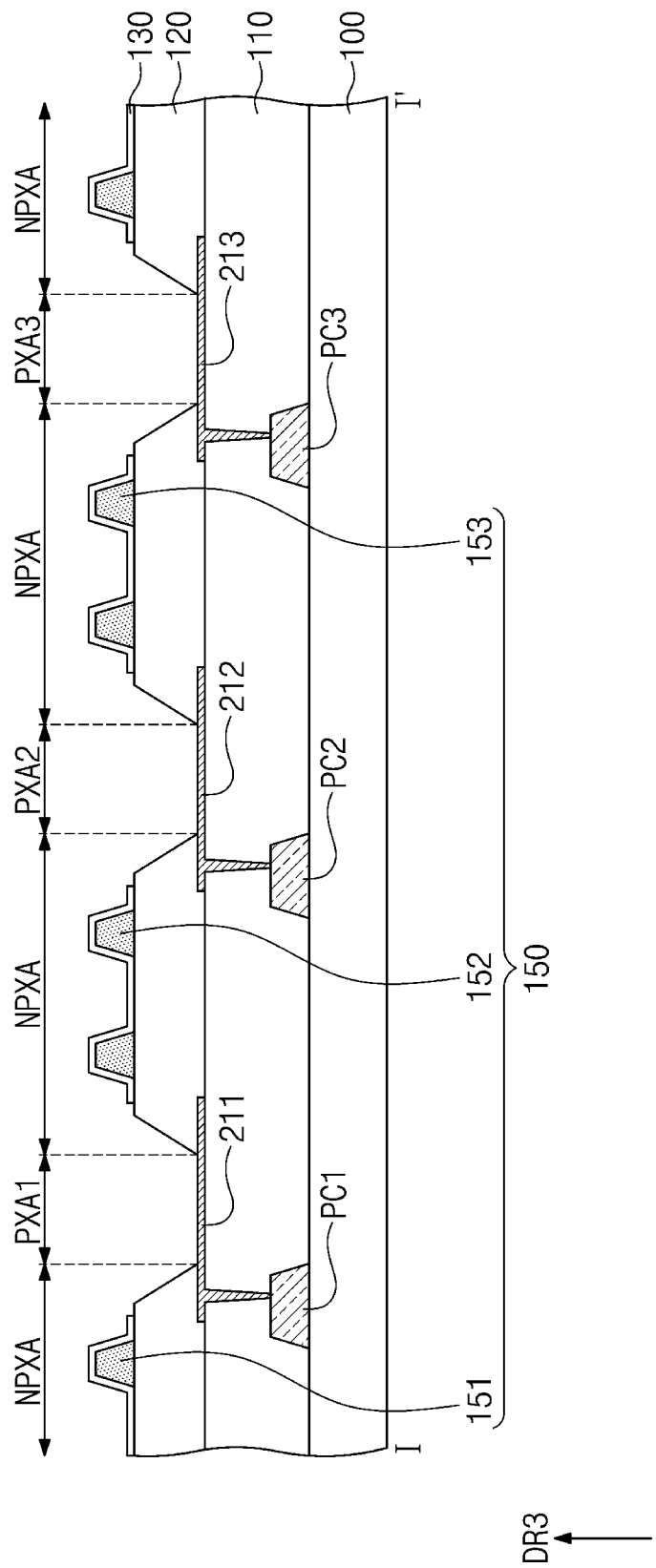

DISPLAY APPARATUS AND METHOD OF MANUFACTURING THE SAME

CROSS-REFERENCE TO RELATED APPLICATION

This application claims priority to and the benefit of Korean Patent Application No. 10-2018-0123413, filed on Oct. 16, 2018, in the Korean Intellectual Property Office (KIPO), the entire content of which is hereby incorporated by reference.

BACKGROUND

1. Field

The present disclosure herein relates to a display apparatus and a method of manufacturing the same, and more particularly, to a display apparatus with improved reliability and a method of manufacturing the same.

2. Description of the Related Art

An organic light emitting display apparatus (from among display apparatuses) is attracting attention as a next-generation display apparatus because of its wide viewing angle, excellent contrast and/or fast response speed.

Generally, the organic light emitting display apparatus may include thin film transistors and organic light emitting elements formed on a substrate, and the organic light emitting elements may emit light themselves to operate (e.g., in the operation of) the organic light emitting display apparatus. The organic light emitting element may include a pixel electrode, an opposite electrode facing the pixel electrode, and a light emitting layer disposed between the pixel electrode and the opposite electrode. The organic light emitting display apparatus may be utilized as a display unit of a small-sized product (such as a portable phone) and may also be utilized as a display unit of a large-sized product (such as a television).

In an organic light emitting display apparatus showing full color, different pixels may emit lights of different colors, and a light emitting layer of each pixel and an opposite electrode provided in common in a plurality of pixels may be formed utilizing deposition masks. As the resolution of the organic light emitting display apparatus increases, a width of an open slit of a mask utilized in a deposition process decreases (e.g., gradually decreases), and it is desired to reduce the dispersion of widths of open slits. In addition, to manufacture a high-resolution organic light emitting display apparatus, it is desired to reduce or eliminate a shadow effect. Thus, a method of performing a deposition process in a state where a mask is in close contact with a substrate may be utilized.

SUMMARY

Aspects according to embodiments of the present disclosure are directed toward a method of manufacturing a display apparatus which is capable of easily removing a lift-off layer and a mask layer by preventing or protecting the lift-off layer and the mask layer from collapsing in a manufacturing process, and a display apparatus with improved reliability.

In an embodiment of the present disclosure, a display apparatus may include a substrate, a pixel defining layer, a spacer, an auxiliary electrode, and an organic light emitting diode.

The substrate may include a light emitting area and a non-light emitting area adjacent to the light emitting area.

The pixel defining layer may be on the non-light emitting area of the substrate.

The spacer may be on the pixel defining layer.

The auxiliary electrode may be on the spacer.

The organic light emitting diode may be on the substrate, and having at least a portion in the light emitting area.

The organic light emitting diode may include a pixel electrode, an intermediate layer on the pixel electrode and including an organic light emitting layer, and an opposite electrode on the intermediate layer and electrically connected to the auxiliary electrode.

In an embodiment, the intermediate layer and/or the opposite electrode may overlap with the spacer.

In an embodiment, the auxiliary electrode and the pixel defining layer may seal the spacer.

In an embodiment, the spacer may include an organic material.

In an embodiment, the pixel defining layer and the spacer may be composed of different materials.

In an embodiment, the pixel defining layer and the spacer may constitute a single unitary body.

In an embodiment, the auxiliary electrode may be in contact with a top surface of the spacer.

In an embodiment, the spacer may be provided in plurality, the spacers may be adjacent to the light emitting area, and each of the spacers may have an island shape.

In an embodiment, the light emitting area may have a polygonal shape when viewed in a plan view, and each of the spacers may be adjacent to a corner of the light emitting area.

In an embodiment, a shortest distance between the spacers adjacent to each other may range from 10 µm to 25 µm.

In an embodiment, the display apparatus may further include an insulating protective layer covering a top surface of the opposite electrode and exposing a portion of the auxiliary electrode.

In an embodiment of the present disclosure, a display apparatus may include a substrate, a pixel defining layer, a spacer, an auxiliary electrode, a pixel electrode, an intermediate layer, and an opposite electrode.

The substrate may include a light emitting area and a non-light emitting area adjacent to the light emitting area.

The pixel defining layer may be on the non-light emitting area of the substrate.

The spacer may be on the pixel defining layer.

The auxiliary electrode may be on the spacer.

The pixel electrode may be on the substrate, and having at least a portion in the light emitting area.

The intermediate layer may be on the pixel electrode and having at least a portion overlapping with the spacer, the intermediate layer including an organic light emitting layer.

The opposite electrode may be on the intermediate layer and may be in contact with the auxiliary electrode, and having at least a portion overlapping with the spacer.

In an embodiment, the auxiliary electrode and the pixel defining layer may seal the spacer.

In an embodiment of the present disclosure, a method of manufacturing a display apparatus may include forming a first pixel electrode to emit a first color light, a second pixel electrode to emit a second color light, and a third pixel electrode to emit a third color light on a substrate, forming a pixel defining layer exposing a portion of the first pixel electrode, a portion of the second pixel electrode, and a portion of the third pixel electrode, forming a first spacer on the pixel defining layer adjacent to the first pixel electrode, forming an auxiliary electrode covering the first spacer, forming a first lift-off layer and a first mask layer on the pixel defining layer, the first lift-off layer exposing the portion of the first pixel electrode, and the first mask layer having a first mask opening exposing the portion of the first pixel electrode, forming a first intermediate layer on the first pixel electrode through the first mask opening, forming a first opposite electrode on the first intermediate layer through the first mask opening, and removing the first lift-off layer and the first mask layer.

In an embodiment, the method may further include forming a first insulating protective layer covering the first opposite electrode through the first mask opening, after the forming of the first opposite electrode.

In an embodiment, the first spacer may be provided in plurality, and each of the first spacers may have an island shape.

In an embodiment, the forming of the first lift-off layer and the first mask layer may include forming a first polymer layer on the pixel defining layer on which the auxiliary electrode is formed, forming a first photoresist layer on the first polymer layer, exposing and developing the first photoresist layer to form the first mask layer, and etching the first polymer layer utilizing the first mask layer as an etch mask to form the first lift-off layer.

In an embodiment, the first lift-off layer may have an undercut shape laterally recessed from an inner side surface of the first mask layer, the inner side defining the first mask opening.

In an embodiment, the first mask layer may overlap with the first spacer when viewed in a plan view.

In an embodiment, the first lift-off layer may expose at least a portion of the first spacer.

In an embodiment, the first spacer may include an organic material.

In an embodiment, the first opposite electrode may be in contact with the auxiliary electrode.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings:

FIGS. 5A to 5H are cross-sectional views illustrating a method of manufacturing a display apparatus, according to an embodiment of the present disclosure.

DETAILED DESCRIPTION

Figure 1:
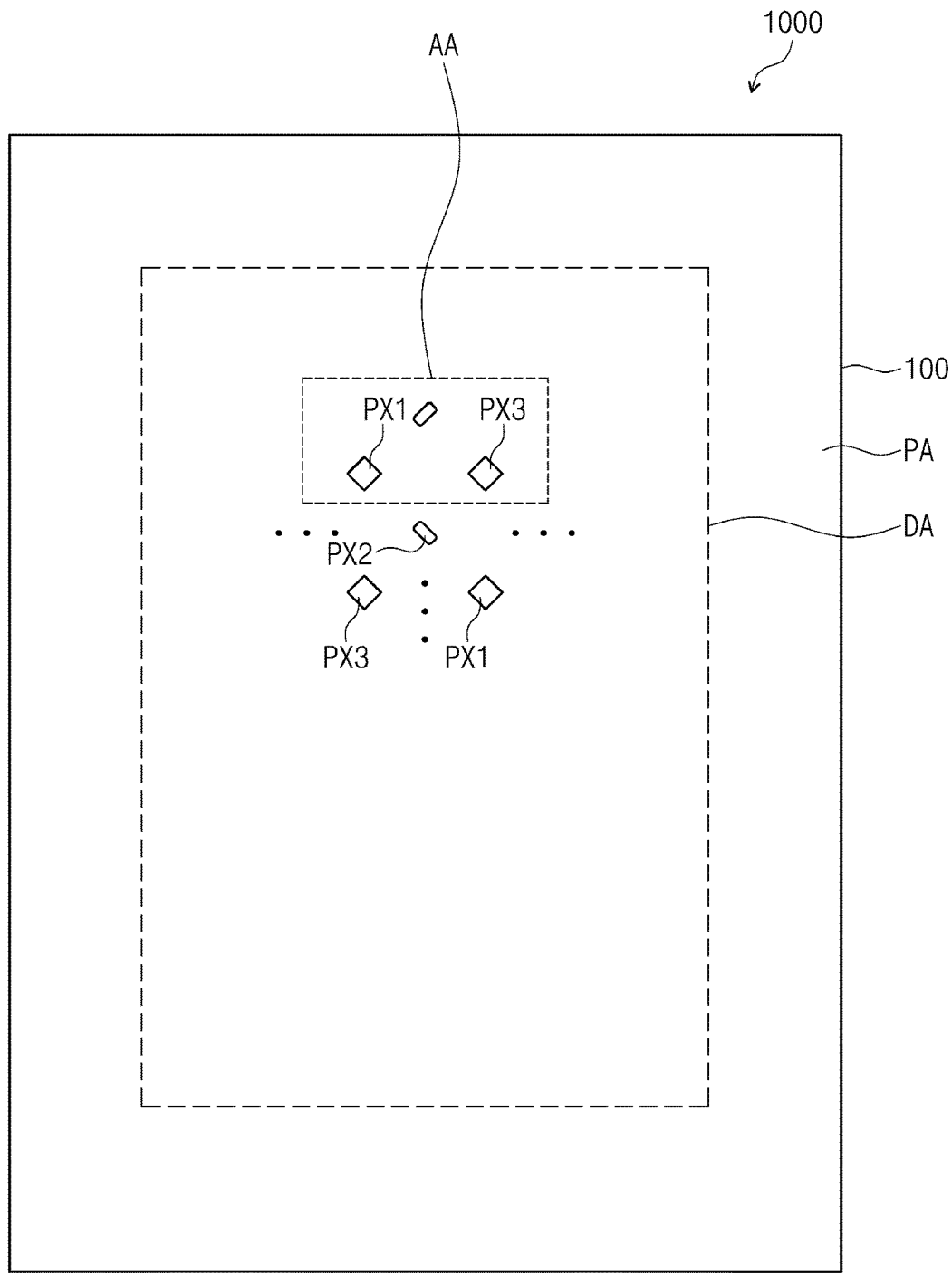
FIG. 1 is a plan view schematically illustrating a display apparatus according to an embodiment of the present disclosure.
Figure 1:
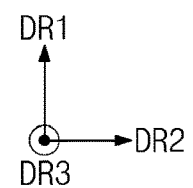

The subject matter of the present disclosure now will be described more fully hereinafter with reference to the accompanying drawings, in which various embodiments are shown. The subject matter of the present disclosure may, however, be embodied in many different forms, and should not be construed as limited to the embodiments set forth herein. Rather, these embodiments are provided so that this disclosure will be thorough and complete, and will fully convey the scopes of the present disclosure to those skilled in the art. Like reference numerals refer to like elements throughout.

It will be understood that when an element such as a layer, region or substrate is referred to as being "on" another element, it can be directly on the other element or intervening elements may be present. In contrast, the term "directly" indicates that there are no intervening elements. As used herein, the term "and/or" includes any and all combinations of one or more of the associated listed items. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." It will be further understood that the terms "comprises," "comprising," "includes," and/or "including," when used in this specification, specify the presence of stated features, regions, integers, steps, operations, elements, components, and/or groups, but do not preclude the presence or addition of one or more other features, regions, integers, steps, operations, elements, components, and/or groups thereof. Expressions such as "at least one of," when preceding a list of elements, modify the entire list of elements and do not modify the individual elements of the list.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings herein.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

FIG. 1 is a plan view schematically illustrating a display apparatus according to an embodiment of the present disclosure.

As illustrated in FIG. 1, a display apparatus 1000 may include a display area DA capable of displaying an image, and a peripheral area PA outside the display area DA. FIG. 1 may be understood as a view of a substrate 100 of the display apparatus 1000. For example, it may be understood that the substrate 100 includes the display area DA and the peripheral area PA.

Pixels configured to emit lights of different colors may be disposed in the display area DA. In this regard, FIG. 1 illustrates first, second and third pixels PX1, PX2 and PX3 which are configured to emit red light, green light and blue light, respectively. In FIG. 1, the first to third pixels PX1, PX2 and PX3 are arranged in a pentile form. However, embodiments of the present disclosure are not limited thereto. In certain embodiments, the arrangement of the pixels may be variously and suitably modified. In some embodiments of the present disclosure, the first to third pixels PX1, PX2 and PX3 may display images of different colors.

The peripheral area PA may correspond to a non-display area, and a driver and a power voltage supply line for providing electrical signals and power to the pixels may be disposed in the peripheral area PA. In addition, the peripheral area PA may include a pad area including pads electrically connected to an electronic device and/or a printed circuit board.

In the present embodiment, the display apparatus 1000 has a rectangular shape when viewed in a plan view. An extending direction of a long side of the display apparatus 1000 is defined as a first direction DR1, and an extending direction of a short side of the display apparatus 1000 is defined as a second direction DR2 (e.g., perpendicular to the first direction DR1). A thickness direction of the display apparatus 1000 is defined as a third direction DR3 (e.g., perpendicular to the first direction DR1 and the second direction DR2).

Figure 2:
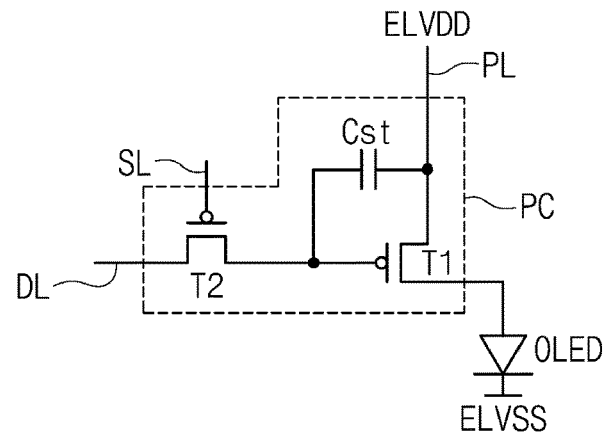
FIG. 2 is an equivalent circuit diagram of a pixel of a display apparatus according to an embodiment of the inventive concepts.

FIG. 2 is an equivalent circuit diagram of a pixel of a display apparatus according to an embodiment of the present disclosure.

Referring to FIG. 2, a pixel may include a pixel circuit PC and a display element connected to the pixel circuit PC. In FIG. 2, an organic light emitting diode OLED is illustrated as the display element. The pixel circuit PC may include a first thin film transistor T1, a second thin film transistor T2, and a storage capacitor Cst.

The second thin film transistor T2 may be a switching thin film transistor and may be connected to a scan line SL and a data line DL. The second thin film transistor T2 may transfer a data voltage inputted from the data line DL to the first thin film transistor T1 in response to a switching voltage inputted from the scan line SL. The storage capacitor Cst may be connected to the second thin film transistor T2 and a driving voltage line PL and may store a voltage corresponding to a difference between the voltage transferred from the second thin film transistor T2 and a first power source voltage ELVDD supplied to the driving voltage line PL.

The first thin film transistor T1 may be a driving thin film transistor and may be connected to the driving voltage line PL and the storage capacitor Cst. The first thin film transistor T1 may control a driving current flowing from the driving voltage line PL to (e.g., the pixel electrode of) the organic light emitting diode OLED in response to a value of the voltage stored in the storage capacitor Cst. The organic light emitting diode OLED may emit light having a set or predetermined brightness determined by the driving current. An opposite electrode (e.g., a cathode) of the organic light emitting diode OLED may be supplied with a second power source voltage ELVSS.

In FIG. 2, the pixel circuit PC includes two thin film transistors and one storage capacitor. However, embodiments of the present disclosure are not limited thereto. In certain embodiments, the number of the thin film transistor(s) and the number of the storage capacitor(s) may be variously and suitably changed depending on the design of the pixel circuit PC.

Figure 3:
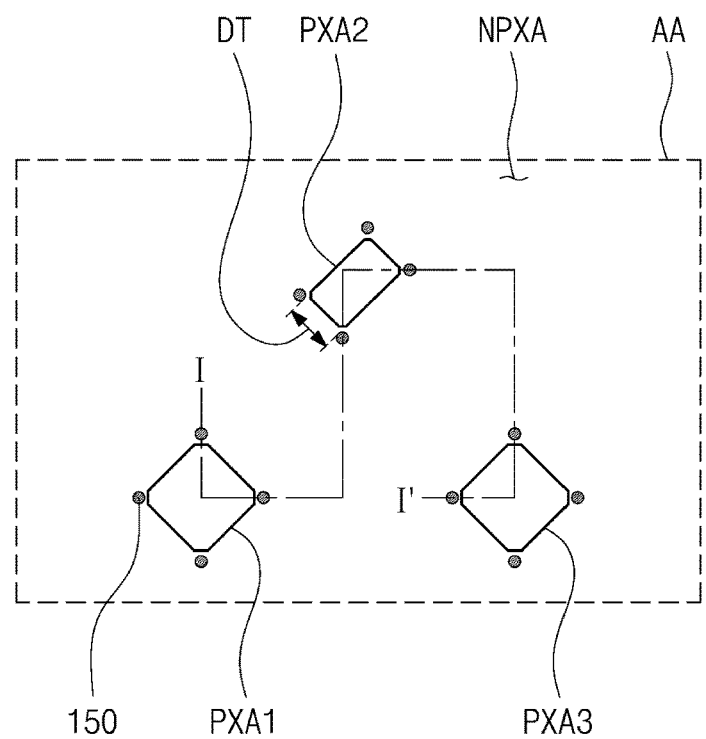
FIG. 3 is an enlarged plan view of the area AA of FIG. 1.
Figure 4:
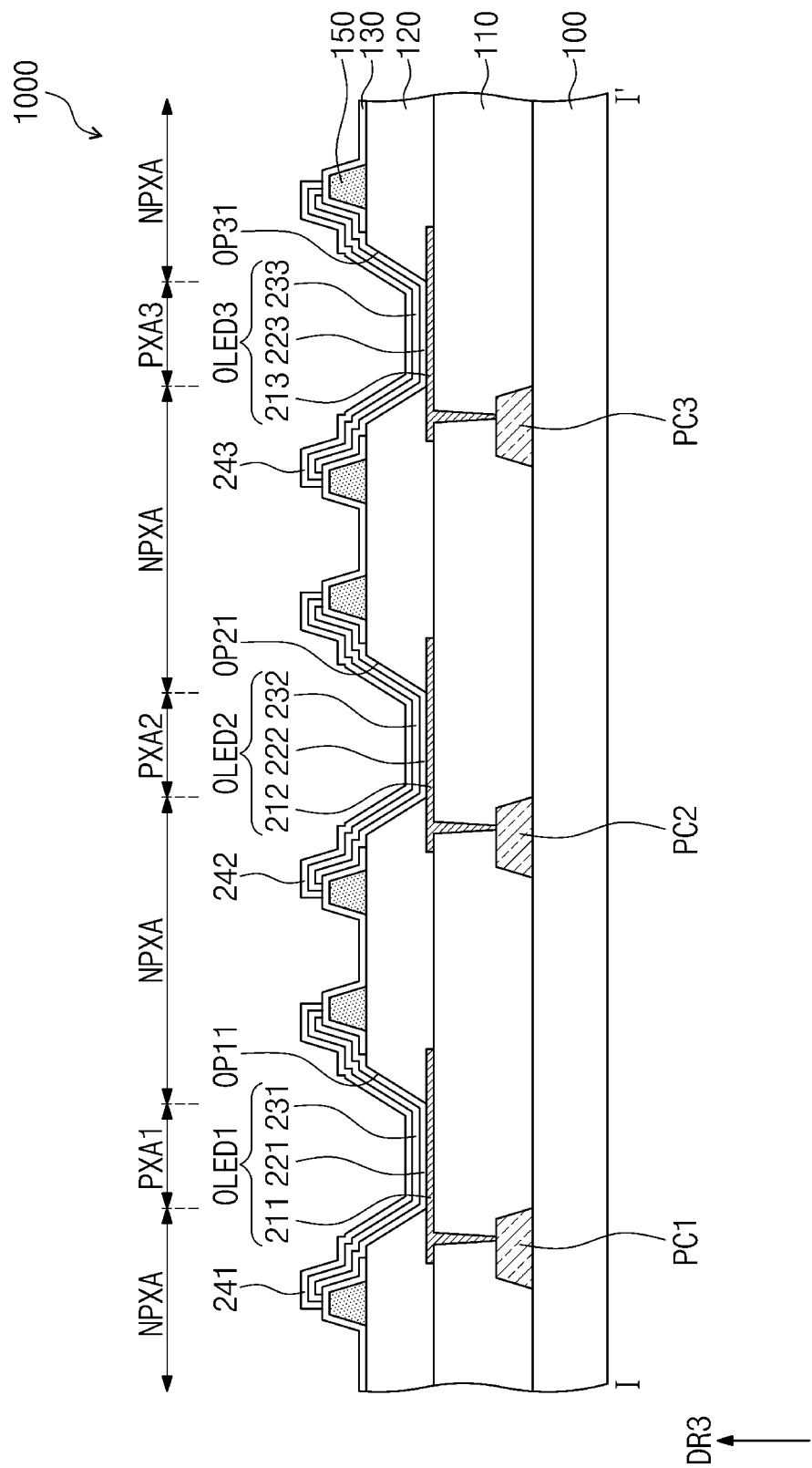
FIG. 4 is a cross-sectional view taken along the line I-I' of FIG. 3.

FIG. 3 is an enlarged plan view of the area AA of FIG. 1, and FIG. 4 is a cross-sectional view taken along the line I-I' of FIG. 3.

Referring to FIG. 3, light emitting areas and a non-light emitting area NPXA may be defined in the display area DA. The light emitting areas may be areas of the first to third pixels PX1 to PX3, in which an image is displayed. The light emitting areas may be defined corresponding to portions of pixel electrodes 211, 212 and 213, which are exposed by openings OP11, OP21 and OP31 of a pixel defining layer 120 (to be described in more detail later).

The area of the first pixel PX1 in which an image is displayed may be defined as a first light emitting area PXA1, the area of the second pixel PX2 in which an image is displayed may be defined as a second light emitting area PXA2, and the area of the third pixel PX3 in which an image is displayed may be defined as a third light emitting area PXA3.

The non-light emitting area NPXA may be an area in which lights emitted from organic light emitting diodes OLED1 to OLED3 are blocked. The non-light emitting area NPXA may be defined (e.g., formed) between the light emitting areas PXA1, PXA2 and PXA3. The non-light emitting area NPXA may be a single area. That is, the non-light emitting area NPXA may form a single continuous area around or surrounding each of the light emitting areas.

Referring to FIG. 4, first to third pixel circuits PC1, PC2 and PC3 utilized to respectively drive the first to third pixels PX1, PX2 and PX3 may be disposed on the substrate 100. In one embodiment, a buffer layer may be disposed between the substrate 100 and the pixel circuits PC1, PC2 and PC3. The first to third pixel circuits PC1, PC2 and PC3 may include the thin film transistors and the storage capacitor described with reference to FIG. 2.

The substrate 100 may include a polymer resin such as polyethersulphone (PES), polyacrylate (PAR), polyetherimide (PEI), polyethylene napthalate (PEN), polyethyleneterepthalate (PET), polyphenylene sulfide (PPS), polyallylate, polyimide (PI), polycarbonate (PC), and/or cellulose acetate propionate (CAP).

A first insulating layer 110 may be disposed on the first to third pixel circuits PC1, PC2 and PC3. The first insulating layer 110 may cover the pixel circuits PC1, PC2 and PC3 and may be a planarization insulating layer to provide a flat surface. The first insulating layer 110 may include an organic insulating material such as polyimide.

Components (e.g., a semiconductor layer, a gate electrode, a source electrode and a drain electrode of the thin film transistors and electrode plates of the storage capacitor) which constitute the first to third pixel circuits PC1 to PC3 may be formed between the substrate 100 and the first insulating layer 110. In addition, inorganic insulating layers and/or organic insulating layers which may be disposed between the semiconductor layer and the gate electrode, between the gate electrode and the source or drain electrode, and between the electrode plates of the storage capacitor may also be formed between the substrate 100 and the first insulating layer 110.

First to third organic light emitting diodes OLED1, OLED2 and OLED3 may be disposed on the first insulating layer 110. The first to third organic light emitting diodes OLED1, OLED2 and OLED3 may be disposed corresponding to the first to third light emitting areas PXA1, PXA2 and PXA3, respectively.

The first to third organic light emitting diodes OLED1, OLED2 and OLED3 may have similar structures, and thus the first organic light emitting diode OLED1 will be mainly described hereinafter in more detail. Descriptions to the second and third organic light emitting diodes OLED2 and OLED3 may be substantially the same as the descriptions to the first organic light emitting diode OLED1.

The first organic light emitting diode OLED1 may include a first pixel electrode 211, a first intermediate layer 221, and a first opposite electrode 231.

The first pixel electrode 211 may include a reflective layer which is formed of silver (Ag), magnesium (Mg), aluminum (Al), platinum (Pt), palladium (Pd), gold (Au), nickel (Ni), neodymium (Nd), iridium (Ir), chromium (Cr), and/or a compound thereof.

Alternatively, the first pixel electrode 211 may include the reflective layer described above, and a transparent conductive oxide (TCO) layer on and/or under the reflective layer. For example, the transparent conductive oxide layer may be formed of indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the first pixel electrode 211 may have a triple-layer structure of ITO/Ag/ITO.

The first intermediate layer 221 may include an organic light emitting layer and may further include a functional layer disposed on and/or under the organic light emitting layer. The functional layer may include a hole injection layer, a hole transfer layer, an electron transfer layer, and/or an electron injection layer. The organic light emitting layer may emit red light, green light, blue light, or white light.

The first opposite electrode 231 may be formed of a conductive material having a low work function. For example, the first opposite electrode 231 may include silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and/or an alloy thereof. In an embodiment, the first opposite electrode 231 may include aluminum (Al), silver (Ag), and/or an alloy (Mg:Ag) of magnesium and silver. In an embodiment, the first opposite electrode 231 may include an alloy in which a silver (Ag) content is greater than a magnesium (Mg) content.

The first intermediate layer 221 and the first opposite electrode 231 may be formed by a thermal deposition method.

The first intermediate layer 221 and the first opposite electrode 231 may be disposed in the first light emitting area PXA1 and a portion of the non-light emitting area NPXA adjacent to the first light emitting area PXA1, but may not be disposed in other portions of the non-light emitting area NPXA.

Each of the second and third organic light emitting diodes OLED2 and OLED3 may have substantially the same structure as the first organic light emitting diode OLED1, and thus detailed descriptions to components thereof are not repeated.

The second organic light emitting diode OLED2 may include a second pixel electrode 212, a second intermediate layer 222, and a second opposite electrode 232. The third organic light emitting diode OLED3 may include a third pixel electrode 213, a third intermediate layer 223, and a third opposite electrode 233. In an embodiment of the present disclosure, the first to third intermediate layers 221, 222 and 223 may include organic light emitting layers configured to emit lights of different colors from each other.

The display apparatus 1000 may further include a pixel defining layer 120. The pixel defining layer 120 may define the non-light emitting area NPXA.

The pixel defining layer 120 may be disposed on the first to third pixel electrodes 211, 212 and 213 and may cover end portions of the first to third pixel electrodes 211, 212 and 213. First to third openings OP11, OP21 and OP31 may be provided (e.g., formed) in the pixel defining layer 120. The first to third openings OP11, OP21 and OP31 may expose portions of the first to third pixel electrodes 211, 212 and 213, respectively. The first to third openings OP11, OP21 and OP31 may correspond to the first to third light emitting areas PXA1, PXA2 and PXA3, respectively.

The first to third intermediate layers 221, 222 and 223 may be disposed on the pixel defining layer 120.

For example, the pixel defining layer 120 may be formed of an organic insulating material such as an acrylic-based organic material and/or benzocyclobutene (BCB). In another embodiment, the pixel defining layer 120 may be formed of an inorganic insulating material such as silicon nitride ($SiN_x$), silicon oxide ($SiO_x$), silicon oxynitride (SiON), and/or silicon oxycarbide (SiOC). When the pixel defining layer 120 is formed of the inorganic insulating material, the pixel defining layer 120 may block a permeation path of oxygen and/or moisture to inhibit, protect or prevent the organic light emitting diodes from being damaged by oxygen and/or moisture.

The display apparatus 1000 may further include an auxiliary electrode 130. The auxiliary electrode 130 may be disposed on the pixel defining layer 120. The auxiliary electrode 130 may be in direct contact with a top surface of the pixel defining layer 120.

The auxiliary electrode 130 may be disposed in the non-light emitting area NPXA. An area of the auxiliary electrode 130 may be less than that of the pixel defining layer 120 in a plan view, and thus the auxiliary electrode 130 may be covered by the pixel defining layer 120 in a plan view. The auxiliary electrode 130 may be formed of a metal layer including a low-resistance metal such as molybdenum (Mo), titanium (Ti), copper (Cu), aluminum (Al), and/or an alloy thereof. In addition, the auxiliary electrode 130 may further include a transparent conductive oxide layer (e.g., indium tin oxide (ITO)) disposed on and/or under the metal layer described above.

The auxiliary electrode 130 may be in contact with the first to third opposite electrodes 231, 232 and 233 so as to be electrically connected to the first to third opposite electrodes 231, 232 and 233. The first to third opposite electrodes 231, 232 and 233 may be electrically connected to each other through the auxiliary electrode 130 and thus may receive the same voltage for driving the first to third organic light emitting diodes OLED1, OLED2 and OLED3.

The display apparatus 1000 may further include a spacer 150. The spacer 150 may be disposed between the pixel defining layer 120 and the auxiliary electrode 130.

The spacer 150 may be disposed in the non-light emitting area NPXA. The spacer 150 may have an island shape and may be provided in plurality around each of the first to third light emitting areas PXA1, PXA2 and PXA3, when viewed in a plan view. In FIG. 3, four spacers 150 spaced apart from each other are disposed around each of the first to third light emitting areas PXA1, PXA2 and PXA3. However, embodiments of the present disclosure are not limited thereto. The number of the spacer(s) 150 disposed around each of the first to third light emitting areas PXA1, PXA2 and PXA3 may be variously and suitably set or changed.

In an embodiment of the present disclosure, each of the first to third light emitting areas PXA1, PXA2 and PXA3 may have a polygonal shape when viewed in a plan view (e.g., in the third direction DR3). The spacer 150 may be disposed adjacent to a corner of each of the first to third light emitting areas PXA1, PXA2 and PXA3 when viewed in a plan view.

The shortest distance DT between the spacers 150 adjacent to each other in a plan view may range from 10 μm to 25 μm. The spacer 150 may support a mask layer to prevent or protect the mask layer from collapsing, in a method of manufacturing a display apparatus (described in more detail later with reference to FIGS. 5C to 5E). However, if the shortest distance between the adjacent spacers 150 is greater than 25 μm, it may be difficult for the spacers 150 to support the mask layer. If the shortest distance is less than 10 μm, an etching solution may not freely permeate between the spacers 150.

In FIG. 3, the spacer 150 has a circular shape in a plan view. However, embodiments of the present disclosure are not limited thereto. The shape of the spacer 150 may be variously and suitably modified.

The spacer 150 may include an organic material.

The spacer 150 may be sealed (e.g., encapsulated or completely covered) by the auxiliary electrode 130. Thus, even though a gas occurs (e.g., is generated) from the organic material included in the spacer 150 in the manufacturing processes, the gas may not be transferred (e.g., may not permeate) to the organic light emitting layers included in the first to third intermediate layers 221, 222 and 223. Thus, the organic light emitting layers may be protected.

The display apparatus 1000 may further include first to third insulating protective layers 241, 242 and 243. The first to third insulating protective layers 241, 242 and 243 may be disposed on the first to third opposite electrodes 231, 232 and 233, respectively, and may cover the first to third opposite electrodes 231, 232 and 233, respectively. The first to third insulating protective layers 241, 242 and 243 may encapsulate the first to third opposite electrodes 231, 232 and 233, respectively, to prevent or protect the first to third opposite electrodes 231, 232 and 233 from being exposed to moisture and/or air.

The first to third insulating protective layers 241, 242 and 243 may be spaced apart from each other. Thus, a portion of the auxiliary electrode 130 may be exposed between the first to third insulating protective layers 241, 242 and 243.

The first to third insulating protective layers 241, 242 and 243 may include an inorganic insulating material such as silicon nitride and/or silicon oxide. The first to third insulating protective layers 241, 242 and 243 may be formed by, for example, a chemical vapor deposition (CVD) method.

An end portion of each of the first to third intermediate layers 221, 222 and 223, an end portion of each of the first to third opposite electrodes 231, 232 and 233, and an end portion of each of the first to third insulating protective layers 241, 242 and 243 may overlap with the spacer 150.

FIGS. 5A to 5H are cross-sectional views illustrating a method of manufacturing a display apparatus, according to an embodiment of the present disclosure. FIGS. 5A to 5H may correspond to cross-sectional views taken along the line I-I' of FIG. 3.

FIGS. 5A to 5H illustrate first to third light emitting areas PXA1, PXA2 and PXA3 and a non-light emitting area NPXA adjacent to (e.g., surrounding) the first to third light emitting areas PXA1, PXA2 and PXA3. The first to third light emitting areas PXA1, PXA2 and PXA3 may be defined as areas for displaying images having different colors.

Referring to FIG. 5A, pixel circuits PC1 to PC3, a first insulating layer 110, first to third pixel electrodes 211, 212 and 213, and a pixel defining layer 120 may be formed on a substrate 100. The pixel circuits PC1 to PC3, the first insulating layer 110, the first to third pixel electrodes 211, 212 and 213 and the pixel defining layer 120 may be formed utilizing any suitable or known methods and a detailed description thereof is not repeated.

Thereafter, a spacer 150 may be formed on the pixel defining layer 120.

An organic material may be deposited on the pixel defining layer 120, and then, a patterning process may be performed on the organic material to form the spacer 150. The spacer 150 may overlap with the pixel defining layer 120.

The spacer 150 may be formed in an island shape around each of the first to third light emitting areas PXA1, PXA2 and PXA3.

The spacer 150 may include first to third spacers 151, 152 and 153.

The first spacer 151 may be formed around the first light emitting area PXA1, the second spacer 152 may be formed around the second light emitting area PXA2, and the third spacer 153 may be formed around the third light emitting area PXA3. In other words, the first spacer 151 may be formed outside the first opening OP11 (see FIG. 4) of the pixel defining layer 120, the second spacer 152 may be formed outside the second opening OP21 (see FIG. 4) of the pixel defining layer 120, and the third spacer 153 may be formed outside the third opening OP31 (see FIG. 4) of the pixel defining layer 120.

The first spacer 151 may be a spacer closest to the first light emitting area PXA1 of the first to third light emitting areas PXA1, PXA2 and PXA3, the second spacer 152 may be a spacer closest to the second light emitting area PXA2 of the first to third light emitting areas PXA1, PXA2 and PXA3, and the third spacer 153 may be a spacer closest to the third light emitting area PXA3 of the first to third light emitting areas PXA1, PXA2 and PXA3.

Thereafter, an auxiliary electrode 130 may be formed on the pixel defining layer 120 on which the spacer 150 is formed. A conductive material may be formed on the pixel defining layer 120 and the spacer 150, and then, a patterning process may be performed on the conductive material to form the auxiliary electrode 130.

The auxiliary electrode 130 may be formed of a metal layer including a low-resistance metal such as molybdenum (Mo), titanium (Ti), copper (Cu), aluminum (Al), and/or an alloy thereof. In addition, the auxiliary electrode 130 may further include a transparent conductive oxide layer (e.g., indium tin oxide (ITO)) disposed on and/or under the metal layer described above.

The auxiliary electrode 130 may overlap with the pixel defining layer 120 and the spacer 150. The auxiliary electrode 130 may cover the spacer 150 and together with the pixel defining layer 120, may seal the spacer 150.

Figure 5B:
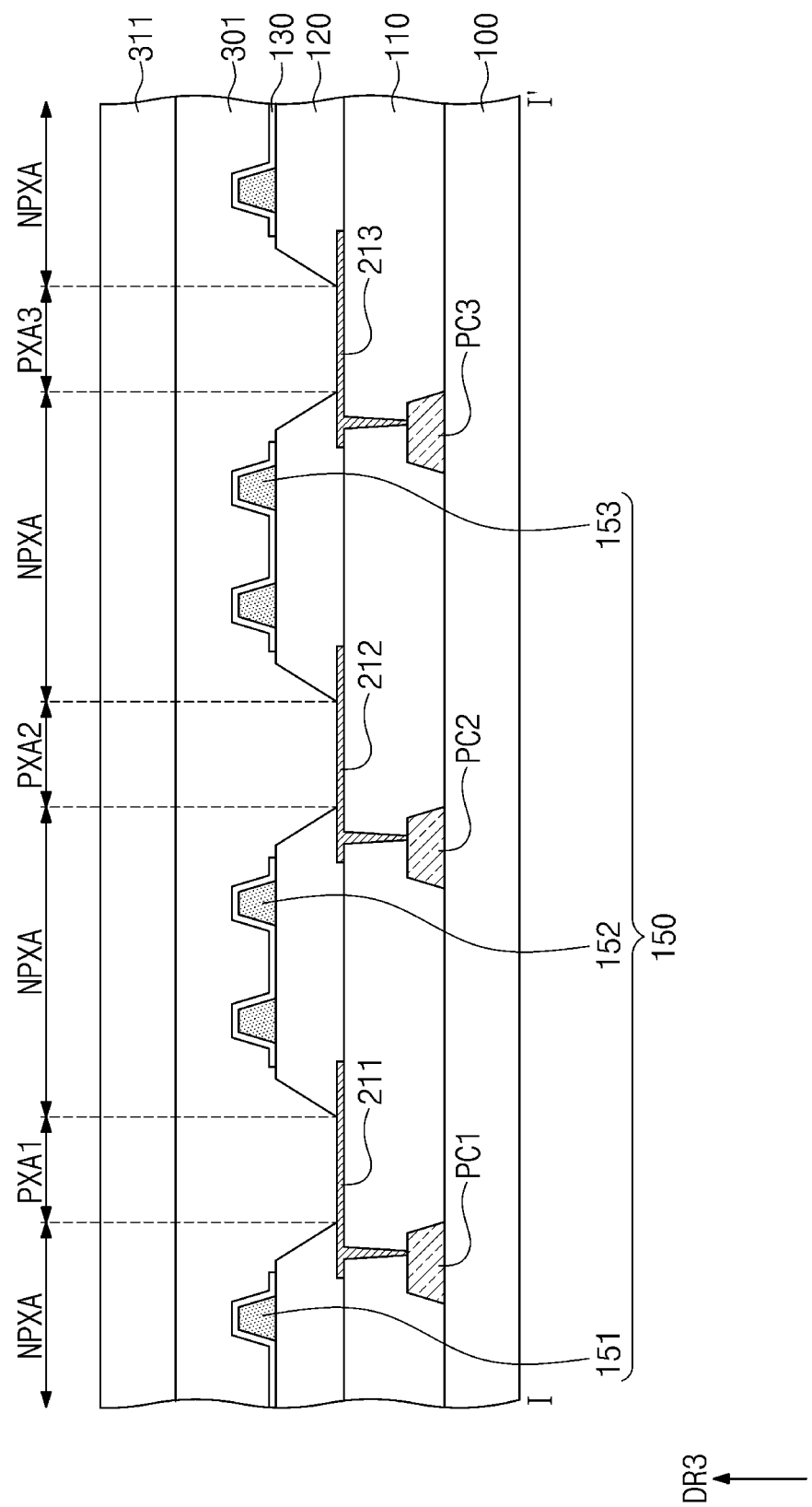

Referring to FIG. 5B, subsequently, a first polymer layer 301 may be formed on the pixel defining layer 120 on which the auxiliary electrode 130 is formed.

The first polymer layer 301 may include a polymer material. For example, the first polymer layer 301 may include a polymer including fluorine. For example, the first polymer layer 301 may include polytetrafluoroethylene, polychlorotrifluoroethylene, polydichlorodifluoroethylene, a copolymer of chlorotrifluoroethylene and dichlorodifluoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and/or a copolymer of chlorotrifluoroethylene and perfluoroalkylvinylether.

To form the first polymer layer 301, a polymer material may be coated on the pixel defining layer 120 on which the auxiliary electrode 130 is formed. Thereafter, the polymer material may reflow (e.g., may be made to flow) by heating the polymer material, and thus the first polymer layer 301 having a flat top surface may be formed.

Next, a photoresist material may be coated on the first polymer layer 301 to form a first photoresist layer 311.

Figure 5C:
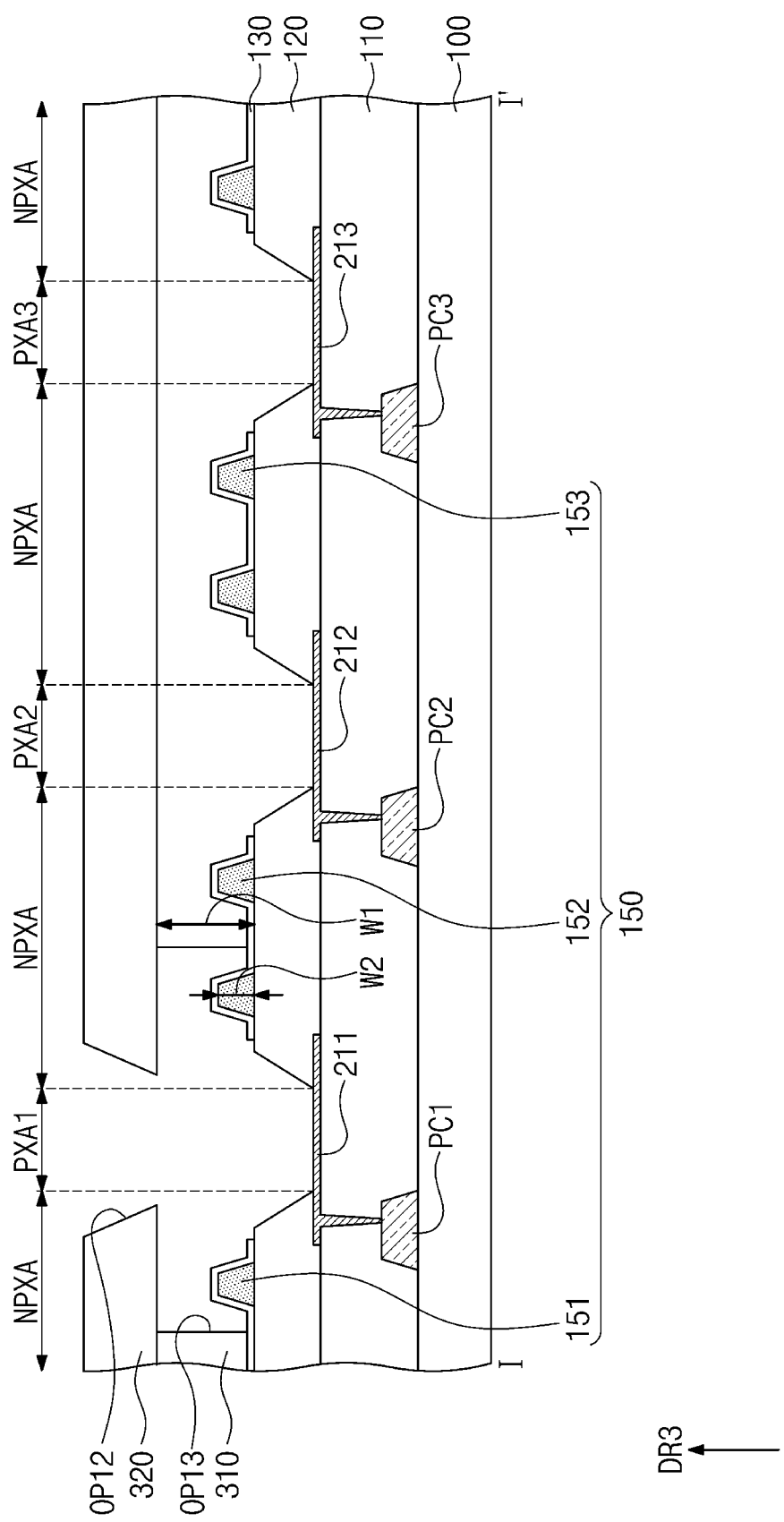

Referring to FIG. 5C, subsequently, the first photoresist layer 311 may be patterned to form a first mask layer 320. A portion of the first photoresist layer 311 which is located at a position corresponding to the first pixel electrode 211 may be removed by exposure and development processes. A first mask opening OP12 exposing the first pixel electrode 211 may be provided (e.g., formed) in the first mask layer 320.

At this time, the first mask layer 320 may overlap with the first spacer 151 when viewed in a plan view.

Subsequently, the first polymer layer 301 may be etched utilizing the first mask layer 320 as an etch mask to form a first lift-off layer 310. A first lift-off opening OP13 exposing the first pixel electrode 211 may be provided (e.g., formed) in the first lift-off layer 310.

When the first polymer layer 301 includes a fluorine polymer, a solvent (e.g., hydrofluoroether) capable of etching the fluorine polymer may be utilized as an etching solution.

The first lift-off layer 310 may have an undercut shape laterally recessed from an inner side surface of the first mask layer 320 which defines the first mask opening OP12. In other words, the first mask layer 320 may have an area wider (e.g., bigger) than that of the first lift-off layer 310 and may cover the first lift-off layer 310, when viewed in a plan view. A size of the first lift-off opening OP13 may be greater than a size of the first mask opening OP12 when viewed in a plan view.

A distance W1 between (e.g., a top surface of) the pixel defining layer 120 and a top surface of the first lift-off layer 310 may be greater than a distance W2 between (e.g., the top surface of) the pixel defining layer 120 and a top surface of the first spacer 151.

The first lift-off layer 310 may expose at least a portion of the first spacer 151. The first lift-off layer 310 may not overlap with at least a portion of the first spacer 151. The first lift-off layer 310 may be spaced apart from the first spacer 151.

Figure 5D:
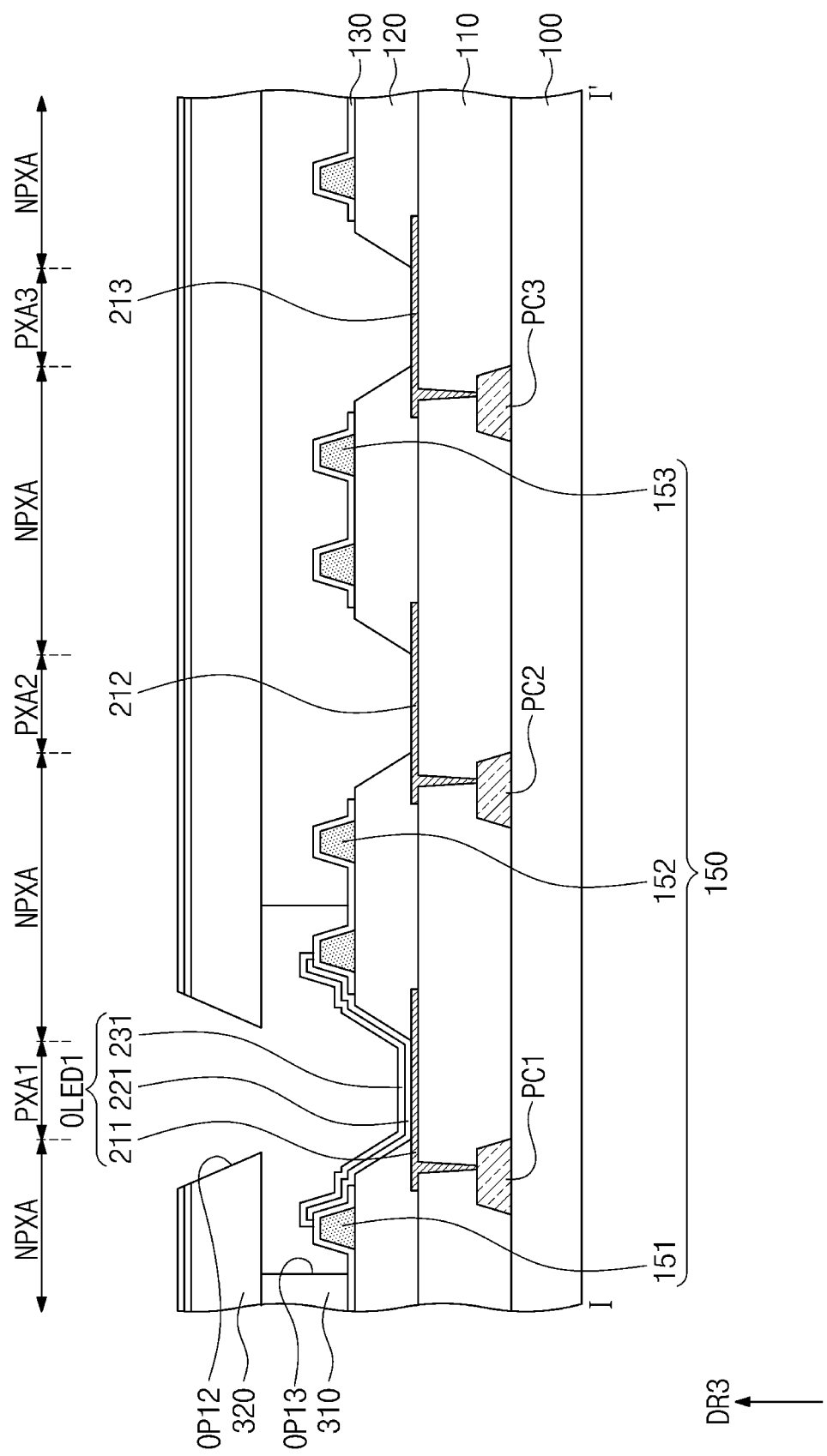

Referring to FIG. 5D, next, a first intermediate layer 221 and a first opposite electrode 231 may be sequentially formed on the first pixel electrode 211 through the first mask opening OP12 of the first mask layer 320. Materials for forming the first intermediate layer 221 and the first opposite electrode 231 may be formed on the first mask layer 320 as well as on the first pixel electrode 211.

The first intermediate layer 221 and the first opposite electrode 231 may be formed to overlap with the first spacer 151 and the auxiliary electrode 130. The first opposite electrode 231 may be in contact with the auxiliary electrode 130. A first organic light emitting diode OLED1 may be formed through the process of FIG. 5D.

Structures and materials of the first intermediate layer 221 and the first opposite electrode 231 may be the same as described with reference to FIG. 4, and thus the detailed descriptions thereto are not repeated.

Figure 5E:
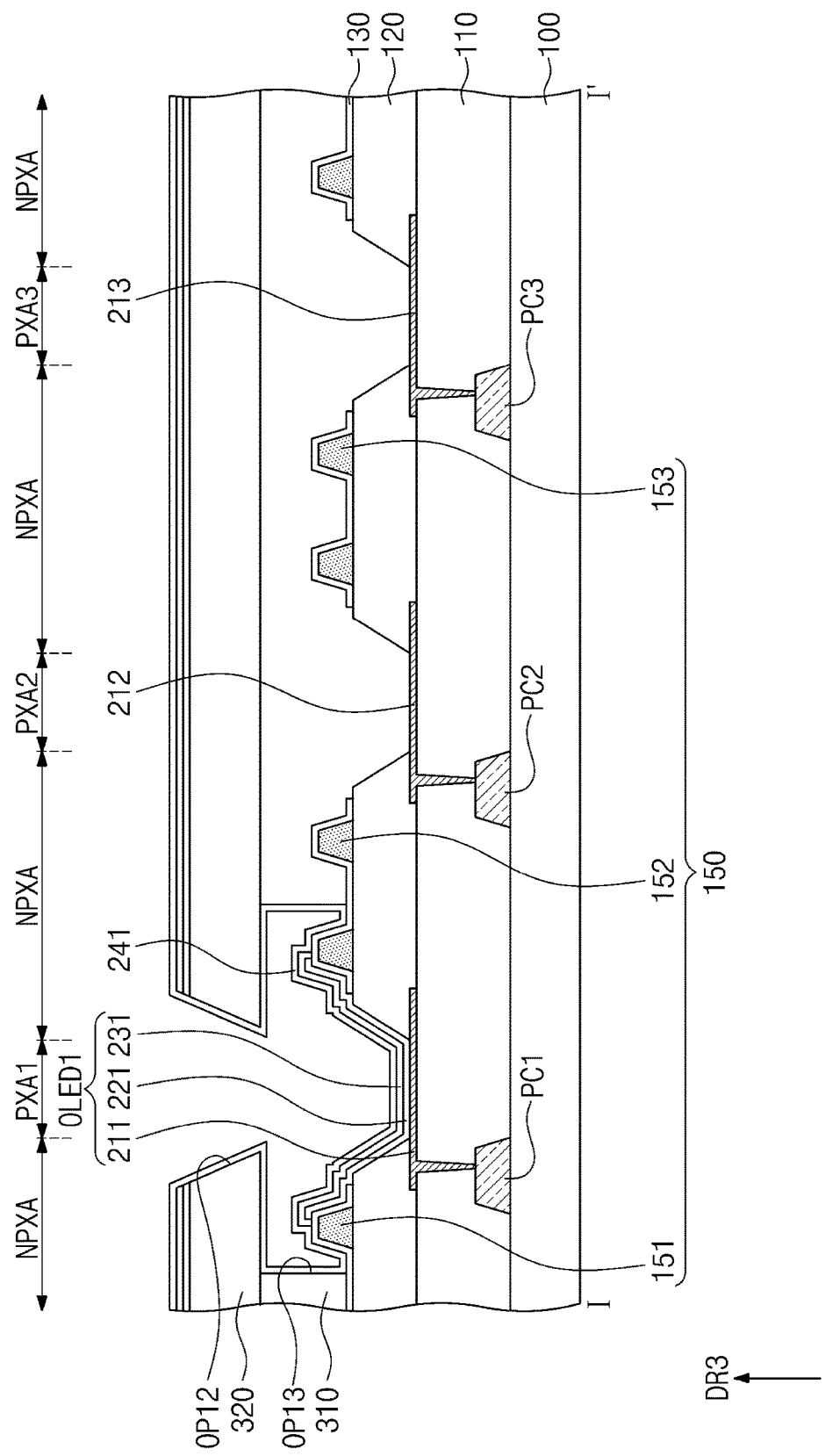

Referring to FIG. 5E, subsequently, a first insulating protective layer 241 may be formed through the first mask opening OP12 of the first mask layer 320. A material for forming the first insulating protective layer 241 may be formed on the first opposite electrode 231 and may also be formed on the first mask layer 320.

The first insulating protective layer 241 may seal or encapsulate the first opposite electrode 231. The material of the first insulating protective layer 241 may be the same as described with reference to FIG. 4, and thus the detailed descriptions thereto are not repeated.

The first intermediate layer 221, the first opposite electrode 231 and the first insulating protective layer 241 described with reference to FIGS. 5D and 5E may be formed through deposition processes.

In the deposition process of the first intermediate layer 221, the first opposite electrode 231, and/or the first insulating protective layer 241, the temperature may be raised such that the first lift-off layer 310 may be softened and reflow (e.g., made to flow), and thus the first lift-off layer 310 may not firmly (e.g., may not adequately) support the first mask layer 320. In this case, a portion of the first mask layer 320 which does not overlap with the first lift-off layer 310 and is adjacent to the first light emitting area PXA1 may collapse toward the pixel defining layer 120. If the first mask layer 320 collapses, a position and a shape of the first mask opening OP12 may be changed. In this case, it may be difficult to form a desired deposition pattern in the first light emitting area PXA1 in a subsequent process. In addition, if the first mask layer 320 collapses, the first mask layer 320 may be in contact with at least one of the first intermediate layer 221, the first opposite electrode 231, or the first insulating protective layer 241, and thus a space into which an etching solution permeates may not be secured (e.g., may be blocked). In this case, it may be difficult to remove the first lift-off layer 310 and the first mask layer 320 in a subsequent process.

However, in the method of manufacturing the display apparatus according to the embodiments of the present disclosure, the first spacer 151 may support the first mask layer 320 when it collapses in the deposition processes of the first intermediate layer 221 and the first opposite electrode 231. The first spacer 151 may be adjacent to the first light emitting area PXA1 and may have the island shape. Thus, even though the first mask layer 320 may collapse, the first mask layer 320 may have an area, that is not in contact with at least one selected from the first intermediate layer 221, the first opposite electrode 231 and the first insulating protective layer 241 between the first spacers 151 (adjacent to each other), and an etching solution for removing the first lift-off layer 310 may be freely provided (e.g., may flow unobstructed) through the area. As a result, the first lift-off layer 310 and the first mask layer 320 may be easily removed.

Figure 5F:
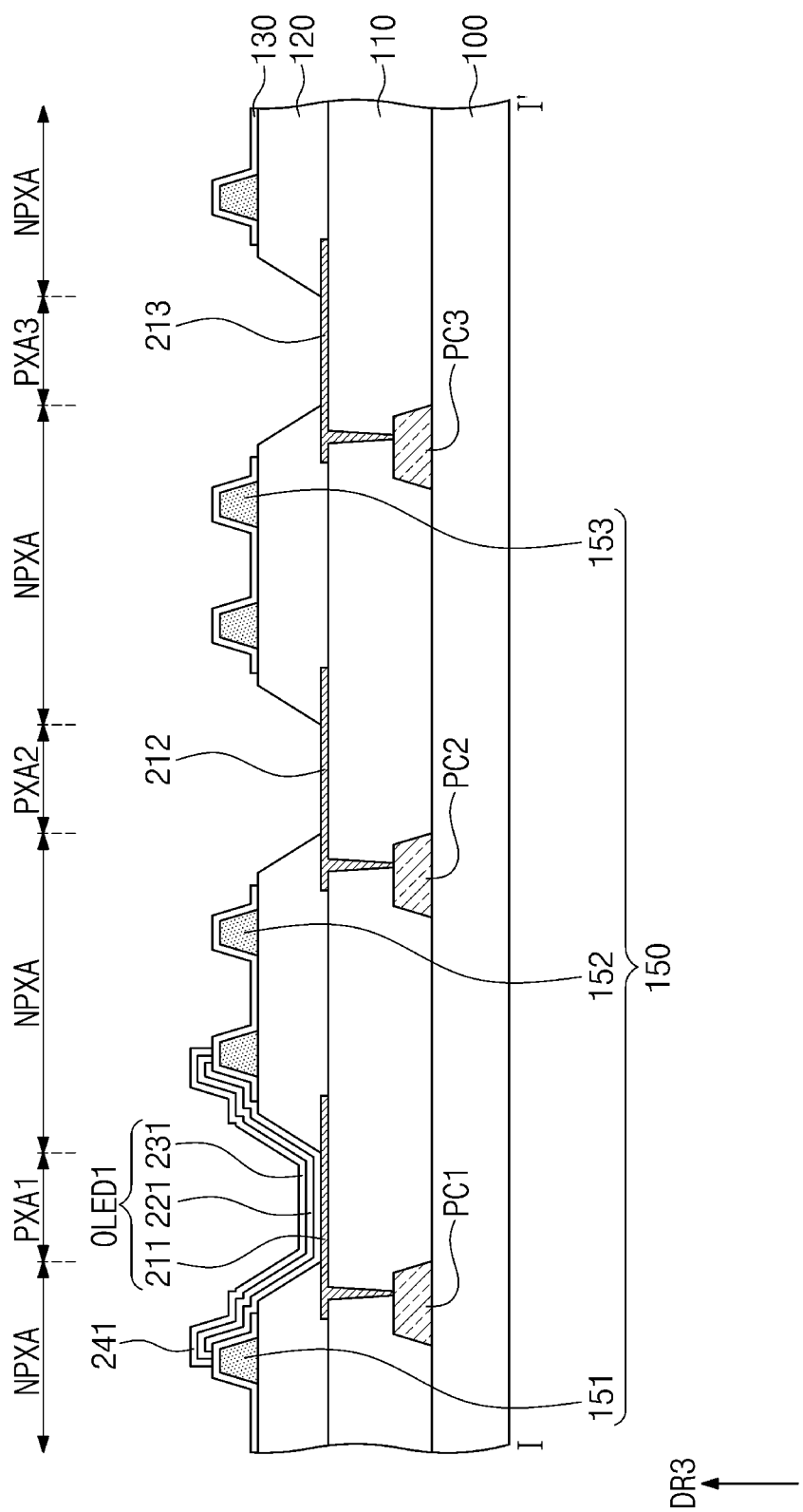

Referring to FIG. 5F, thereafter, the first lift-off layer 310 and the first mask layer 320 may be removed. The first lift-off layer 310 and the first mask layer 320 may be removed utilizing an etching solution.

When the first lift-off layer 310 includes a fluorine polymer, a solvent (e.g., hydrofluoroether) capable of etching the fluorine polymer may be utilized as the etching solution.

The first organic light emitting diode OLED1 and the first insulating protective layer 241 may be formed in the first light emitting area PXA1 through the processes of FIGS. 5A to 5F.

Figure 5G:
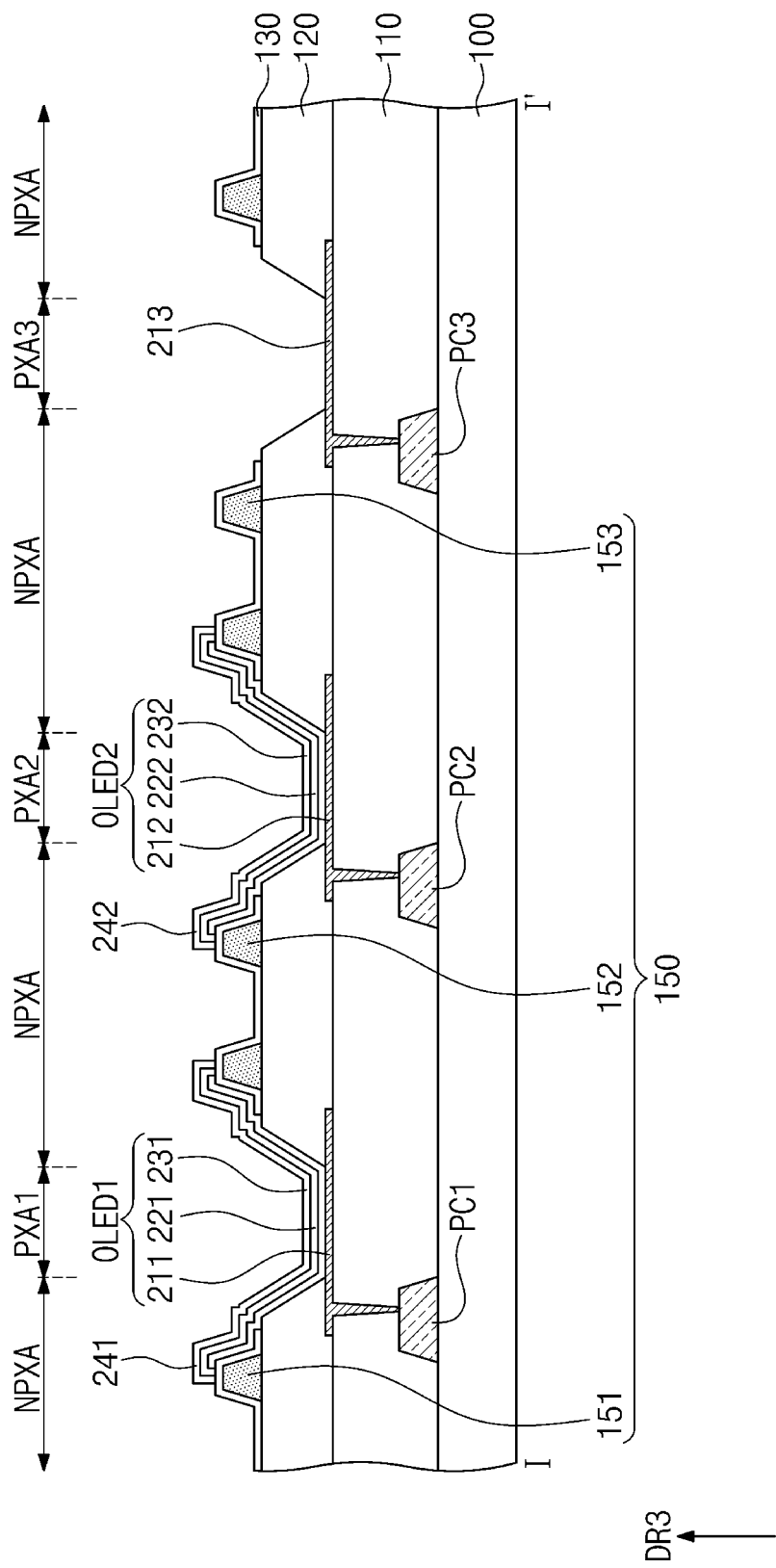

Thereafter, processes of forming a second organic light emitting diode OLED2 and a second insulating protective layer 242 in the second light emitting area PXA2 may be performed. The second organic light emitting diode OLED2 and the second insulating protective layer 242 may be formed by repeatedly performing (e.g., by repeating) the processes of FIGS. 5B to 5F on the second light emitting area PXA2. The processes of forming the second organic light emitting diode OLED2 and the second insulating protective layer 242 may be substantially the same as the processes of forming the first organic light emitting diode OLED1 and the first insulating protective layer 241, and thus the detailed descriptions thereto are not repeated. FIG. 5G is a view in which the second organic light emitting diode OLED2 and the second insulating protective layer 242 are formed.

Figure 5H:
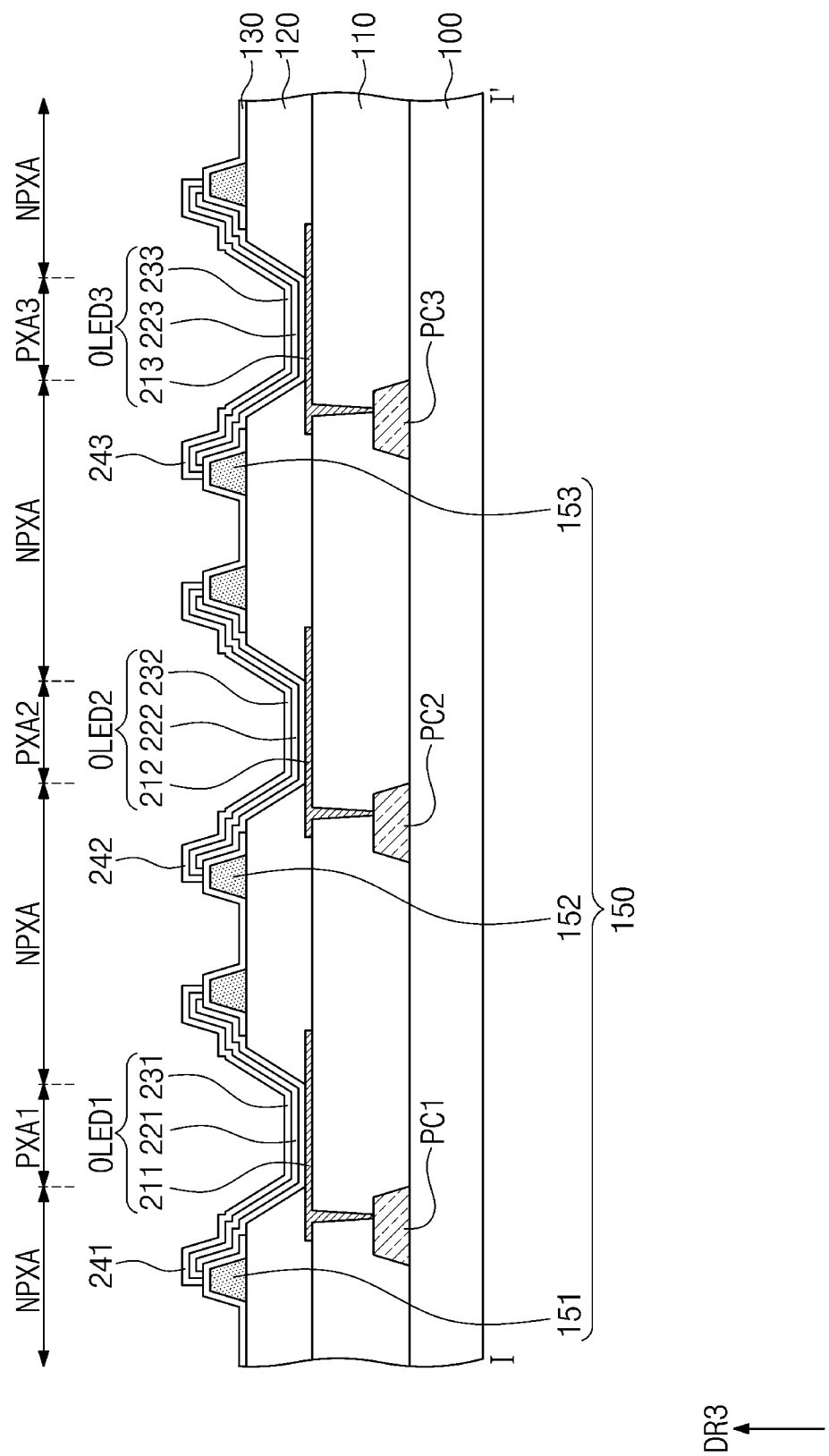

Thereafter, processes of forming a third organic light emitting diode OLED3 and a third insulating protective layer 243 in the third light emitting area PXA3 may be performed. The third organic light emitting diode OLED3 and the third insulating protective layer 243 may be formed by repeatedly performing (e.g., by repeating) the processes of FIGS. 5B to 5F on the third light emitting area PXA3. The processes of forming the third organic light emitting diode OLED3 and the third insulating protective layer 243 may be substantially the same as the processes of forming the first organic light emitting diode OLED1 and the first insulating protective layer 241, and thus the detailed descriptions thereto are not repeated. FIG. 5H is a view in which the third organic light emitting diode OLED3 and the third insulating protective layer 243 are formed.

Figure 6:
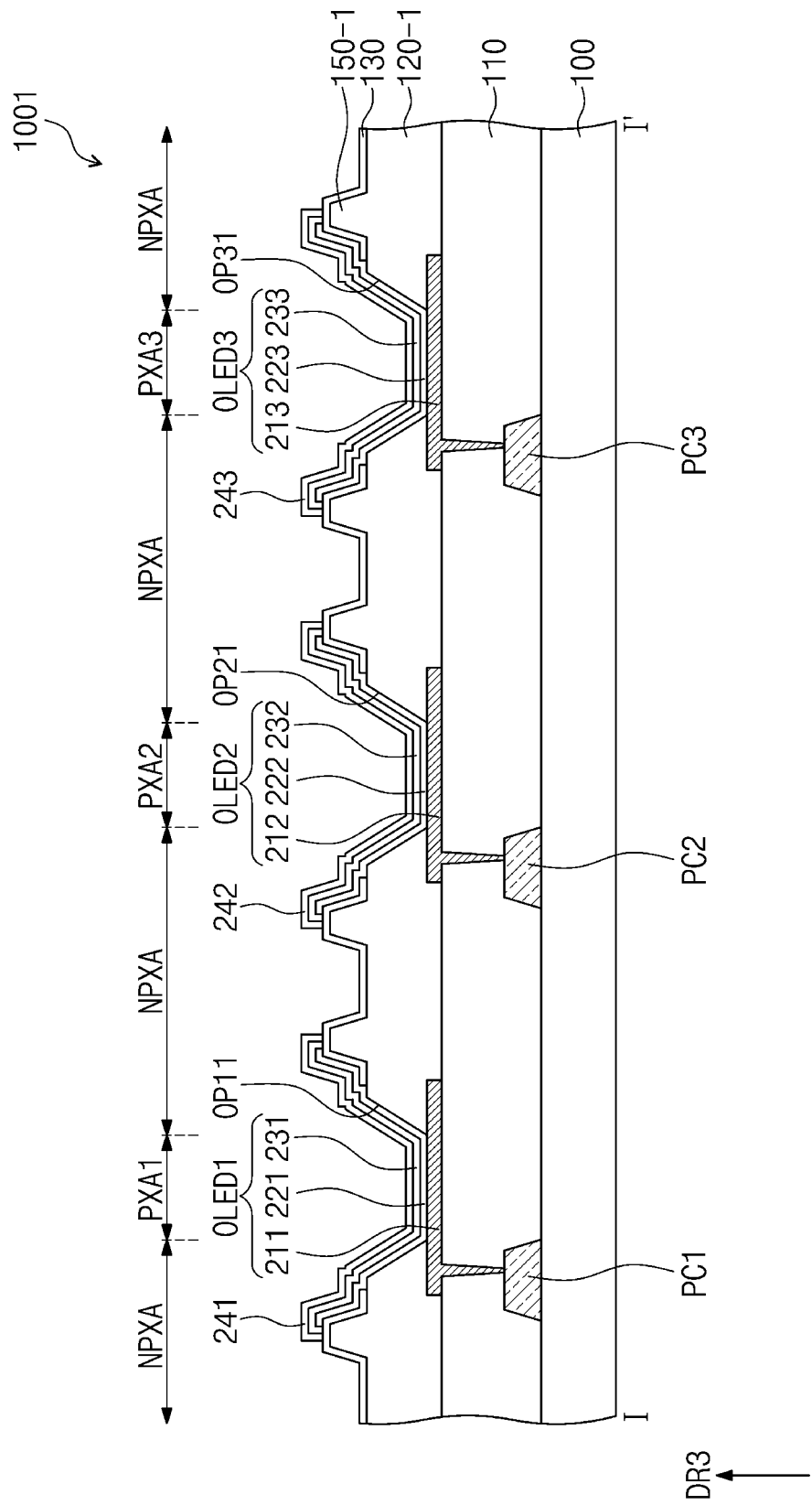
FIG. 6 is a cross-sectional view taken along the line I-I' of FIG. 3 to illustrate a display apparatus according to an embodiment of the present disclosure.

FIG. 6 is a cross-sectional view taken along the line I-I' of FIG. 3 to illustrate a display apparatus according to an embodiment of the present disclosure.

A spacer and a pixel defining layer of a display apparatus 1001 of FIG. 6 are different from the spacer and the pixel defining layer of the display apparatus 1000 of FIG. 4, and the other components of the display apparatus 1001 may be substantially the same as corresponding components of the display apparatus 1000. Hereinafter, the spacer and the pixel defining layer of the display apparatus 1001 will be mainly described with reference to FIG. 6, and descriptions to other components will not be repeated.

The display apparatus 1001 may include a pixel defining layer 120-1 and a spacer 150-1 disposed on the pixel defining layer 120-1. The pixel defining layer 120-1 and the spacer 150-1 may constitute a single unitary (integral) body.

The pixel defining layer 120-1 and the spacer 150-1 may be formed of the same material. The pixel defining layer 120-1 and the spacer 150-1 may include an organic material.

The pixel defining layer 120-1 and the spacer 150-1 may be formed utilizing a halftone mask through the same process.

In the display apparatus 1001 according to the embodiment of FIG. 6, the pixel defining layer 120-1 and the spacer 150-1 may be formed by the same process, and thus one patterning process may be eliminated. Thus, according to the embodiment of FIG. 6, manufacturing processes may be simplified.

In the method of manufacturing the display apparatus according to the embodiments of the present disclosure, the spacer overlapping with the mask layer may be formed to prevent or protect the lift-off layer and the mask layer from collapsing. Thus, the lift-off layer and the mask layer may be easily removed in a subsequent process.

In addition, the spacer may be covered by the auxiliary electrode, and thus it is possible to reduce or prevent a gas caused by outgassing from being transferred (e.g., permeate) to the organic light emitting diode.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the subject matter of present disclosure have been described with reference to example embodiments, it will be apparent to those skilled in the art that various changes and modifications may be made without departing from the spirits and scopes of the present disclosure. Therefore, it should be understood that the above embodiments are not limiting, but illustrative. Thus, the scopes of the present disclosure are to be determined by the broadest permissible interpretation of the following claims and their equivalents, and shall not be restricted or limited by the foregoing description.

What is claimed is:

1. A display apparatus comprising:
a substrate having a light emitting area and a non-light emitting area adjacent to the light emitting area;
a pixel defining layer on the non-light emitting area of the substrate;
a spacer on the pixel defining layer;
an auxiliary electrode on the spacer; and
an organic light emitting diode on the substrate and having at least a portion in the light emitting area,
wherein the organic light emitting diode comprises: a pixel electrode; an intermediate layer on the pixel electrode and comprising an organic light emitting layer; and an opposite electrode on the intermediate layer and electrically connected to the auxiliary electrode.

2. The display apparatus of claim 1, wherein the intermediate layer and/or the opposite electrode overlaps with the spacer.

3. The display apparatus of claim 1, wherein the auxiliary electrode and the pixel defining layer seal the spacer.

4. The display apparatus of claim 1, wherein the spacer comprises an organic material.

5. The display apparatus of claim 4, wherein the pixel defining layer and the spacer are composed of different materials from each other.

6. The display apparatus of claim 1, wherein the pixel defining layer and the spacer constitute a single unitary body.

7. The display apparatus of claim 1, wherein the auxiliary electrode is in contact with a top surface of the spacer.

8. The display apparatus of claim 1, wherein the spacer is provided in plurality adjacent to the light emitting area, and wherein each of the spacers has an island shape.

9. The display apparatus of claim 8, wherein the light emitting area has a polygonal shape when viewed in a plan view, and
wherein each of the spacers is adjacent to a corner of the light emitting area.

10. The display apparatus of claim 8, wherein a shortest distance between the spacers adjacent to each other ranges from 10 μm to 25 μm.

11. A display apparatus comprising:
a substrate having a light emitting area and a non-light emitting area adjacent to the light emitting area;
a pixel defining layer on the non-light emitting area of the substrate;
a spacer on the pixel defining layer;
an auxiliary electrode on the spacer;
a pixel electrode on the substrate and having at least a portion in the light emitting area;
an intermediate layer on the pixel electrode and having at least a portion overlapping with the spacer, the intermediate layer comprising an organic light emitting layer; and
an opposite electrode on the intermediate layer and in contact with the auxiliary electrode, the opposite electrode having at least a portion overlapping with the spacer.

12. The display apparatus of claim 11, wherein the auxiliary electrode and the pixel defining layer seal the spacer.

* * * * *